United States Patent
Paone et al.

(10) Patent No.: US 7,868,391 B2
(45) Date of Patent: Jan. 11, 2011

(54) 3-D SINGLE GATE INVERTER

(75) Inventors: Phil Christopher Felice Paone, Rochester, MN (US); David P. Paulsen, Dodge Center, MN (US); John E. Sheets, II, Zumbrota, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/478,098

(22) Filed: Jun. 4, 2009

(65) Prior Publication Data
US 2010/0308413 A1 Dec. 9, 2010

(51) Int. Cl.
H01L 29/76 (2006.01)
H01L 29/94 (2006.01)
H01L 31/062 (2006.01)
H01L 31/113 (2006.01)
H01L 31/119 (2006.01)
H01L 27/01 (2006.01)
H01L 27/12 (2006.01)
H01L 31/0392 (2006.01)
H01L 23/62 (2006.01)

(52) U.S. Cl. ............... 257/369; 257/335; 257/338; 257/341; 257/350; 257/351; 257/357; 257/371; 257/401; 257/E27.026; 257/E27.027; 257/E27.059; 257/E27.06; 257/E27.062; 257/E27.064

(58) Field of Classification Search ............... 257/335, 257/338, 341, 350–351, 357, 369, 371, 401, 257/E27.026, E27.027, E27.059, E27.06, 257/E27.062, E27.064
See application file for complete search history.

(56) References Cited

U.S. PATENT DOCUMENTS

| | | | | |
|---|---|---|---|---|
| 5,012,306 A | * | 4/1991 | Tasch et al. | 257/335 |
| 5,093,275 A | * | 3/1992 | Tasch et al. | 438/300 |
| 5,312,768 A | * | 5/1994 | Gonzalez | 438/227 |
| 7,355,237 B2 | * | 4/2008 | Lutze et al. | 257/314 |
| 7,560,379 B2 | * | 7/2009 | Kohli et al. | 438/630 |
| 7,713,828 B2 | * | 5/2010 | Yuki | 438/300 |
| 2006/0252191 A1 | * | 11/2006 | Kammler et al. | 438/197 |
| 2007/0184572 A1 | * | 8/2007 | Kohli et al. | 438/97 |
| 2009/0114997 A1 | * | 5/2009 | Tong et al. | 257/384 |
| 2009/0224368 A1 | * | 9/2009 | Sudo | 257/607 |

OTHER PUBLICATIONS

IBM U.S. Appl. No. 12/416,264, David H. Allen, et al., "Enhanced Field Effect Transistor" filed Apr. 1, 2009.

* cited by examiner

*Primary Examiner*—Ida M Soward
(74) *Attorney, Agent, or Firm*—Robert R. Williams

(57) ABSTRACT

A 3-D (Three Dimensional) inverter having a single gate electrode. The single gate electrode has a first gate dielectric between the gate electrode and a body of a first FET (Field Effect transistor) of a first doping type, the first FET having first source/drain regions in a semiconductor substrate, or in a well in the semiconductor substrate. The single gate electrode has a second gate dielectric between the gate electrode and a body of a second FET of opposite doping to the first FET. Second source/drain regions of the second FET are formed from epitaxial layers grown over the first source/drain regions.

8 Claims, 7 Drawing Sheets

Add Contacts for Supplies and Output.
GND Contact shown in Top View (Fig. 2)

Fig. 1A
Creation of S/D regions, Gate with top & bottom gate dielectrics, spacers to isolate gate

Fig. 1B
Beginning of P+ Epi growth over S/D regions

Fig. 1C
Completion of N+ Epi growth over S/D regions

Fig. 1D
Growth of P- Epi over P+ Epi, sufficient to cover second gate oxide

Fig. 1E

Growth of oxide over STI regions, planarization by chemical/mechanical polishing

Fig. 1F

Oxygen Implant To Separate S/D of NFET from S/D of PFET

Fig. 1G

Etch Holes Through Epi and then Through Implanted Oxide

Fig. 1H

Line Sidewalls & Bottom of Isolated contact

Fig. 1I

Etch Base of Isolated Contact

Fig. 1J

Fill Holes With Conductive Material

Fig. 1K

Add Contacts for Supplies and Output. GND Contact shown in Top View (Fig. 2)

Fig. 2
Top View

3-D SINGLE GATE INVERTER

FIELD OF THE INVENTION

This invention relates generally to semiconductor chips, and more specifically to increased density inverters.

SUMMARY OF EMBODIMENTS OF THE INVENTION

A Complementary Metal Oxide Semiconductor (CMOS) inverter comprises an N-Channel Field Effect Transistor (NFET) and a P-Channel Field Effect Transistor (PFET). A source of the NFET is connected to a first supply voltage (typically Gnd). A source of the PFET is connected to a second supply voltage (typically Vdd). A drain of the NFET and a drain of the PFET are connected together and serve as an output of the inverter. A gate of the NFET and a gate of the PFET are connected together and serve as an input to the inverter.

An embodiment of the present invention comprises a 3-D (three dimensional) single gate inverter. The inverter has a first FET (Field Effect Transistor) of a first kind (e.g., a PFET) having suitably doped (P+ for a PFET embodiment) first source/drain regions in a semiconductor substrate, or in a suitably doped well in the semiconductor substrate. A first epitaxial layer of doping opposite of the first source/drain regions (e.g., first epitaxial growth may be N+ if the first source/drain regions are doped P+) is grown over the first source drain regions. The first epitaxial layer serves as second source/drain regions for a second FET, the second FET of a type opposite the first FET, (e.g., an NFET). A gate electrode having a first gate dielectric on a bottom surface of the gate electrode and a second gate dielectric on a top surface of the gate electrode serves as a gate for the first FET and for the second FET. A second epitaxial layer having a doping opposite the first epitaxial growth (e.g., second epitaxial layer may be P– if the first epitaxial layer is N+) is grown from the first epitaxial layer, and the second epitaxial layer is grown thick enough to cover the second gate dielectric to serve as a body of the second FET.

The first source/drain regions are electrically isolated from the first epitaxial layer by, for example, an oxygen implant.

A first hole and a second hole are etched through the first epitaxial layer and the electrical insulator. An isolated contact is formed from the first hole by producing electrically insulating sidewalls in portions of the first hole to electrically isolate the first hole from the first epitaxial layer. Electrically conducting material, such as tungsten, is used to fill the first hole and the second hole. The electrically conducting material in the isolated contact makes electrical contact to a source of the first transistor, but not to the first epitaxial layer, because of the electrically insulating sidewalls. The electrically conducting material in the second hole, a non isolated contact, makes electrical contact with both a drain of the first FET and a drain of the second FET, thereby electrically connecting drains of the first FET and the second FET. Contacts are formed for the gate electrode, a source of the second FET, and the electrically conducting material in the first and second holes.

BRIEF DESCRIPTION OF THE DRAWINGS

FIG. 1 shows the area of the semiconductor chip at a stage in a semiconductor process for making an the 3-D single gate inverter after completion of creation of source/drain regions type in a substrate (or well), a gate electrode (typically simply called "gate") having gate oxide on top and bottom surfaces of the gate electrode, and creation of spacers on vertical surfaces of the gate electrode.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Figure 1A:
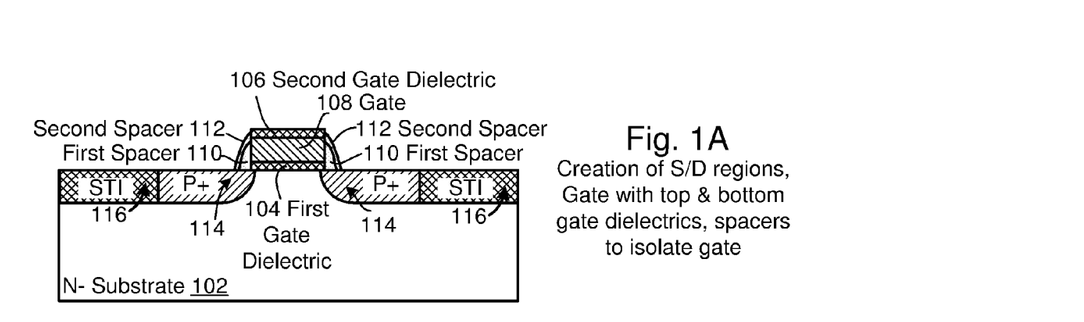
FIG. 1A is a cross sectional view of a semiconductor chip in an area of the semiconductor chip in which a 3-D single gate inverter is formed.
Figure 1B:
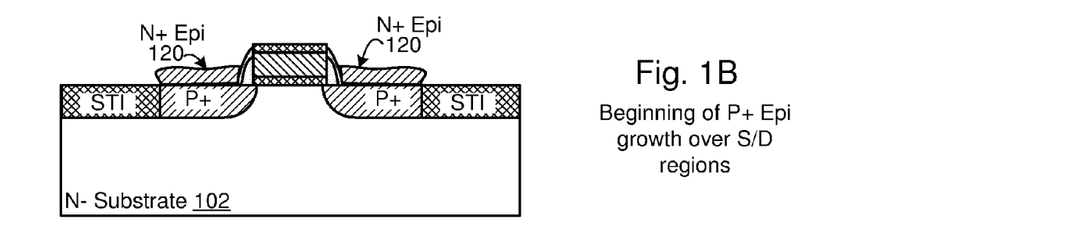
FIG. 1B shows the cross sectional view of FIG. 1A further including a partial creation of a first epitaxial layer comprising epitaxial growth of a first doping type over the source/drain regions.
Figure 1C:
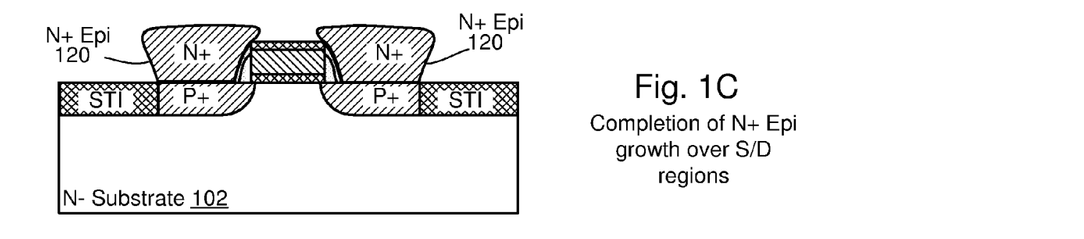
FIG. 1C shows the cross sectional view of FIG. 1B upon completion of creation of the first epitaxial layer.
Figure 1D:
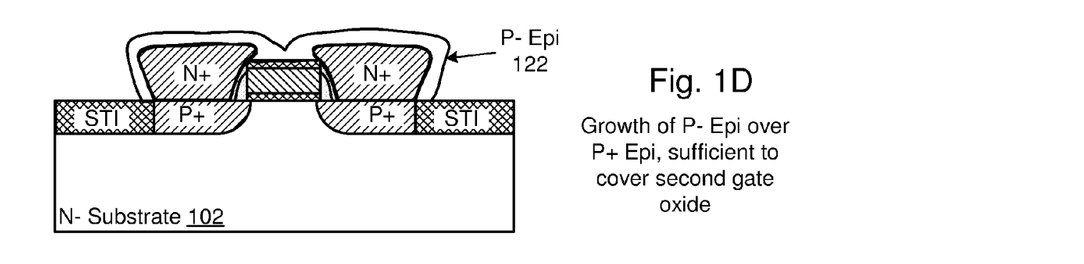
FIG. 1D shows the cross sectional view of FIG. 10 upon completion of grown of a second epitaxial layer comprising epitaxial growth of a second doping type.
Figure 1E:
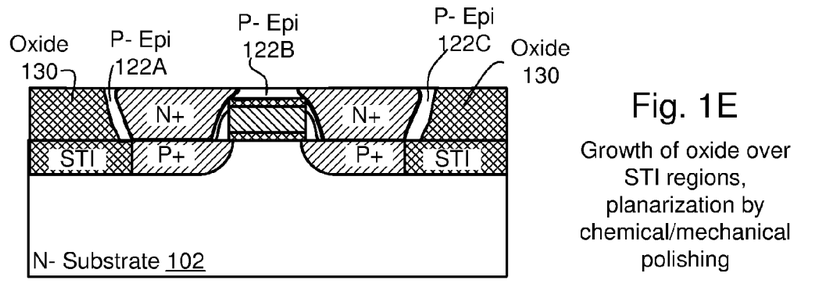
FIG. 1E shows the cross sectional view of FIG. 1D upon completion of oxide growth over shallow trench isolation regions and the epitaxial growths of the second types, and further completion of planarization by, e.g., chemical/mechanical polishing.
Figure 1F:
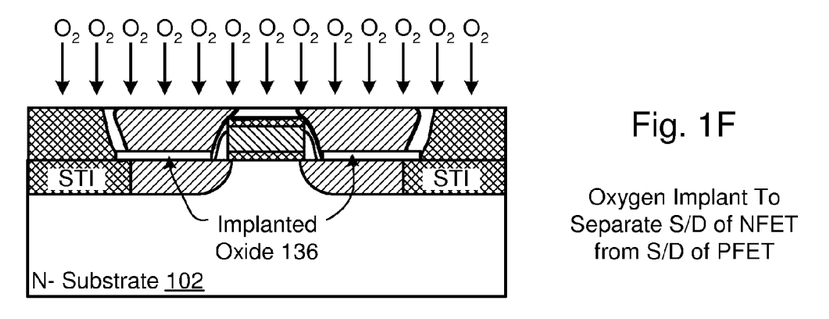
FIG. 1F shows the cross sectional view of FIG. 1E further including an Oxygen implant to form an implanted oxide.
Figure 1G:
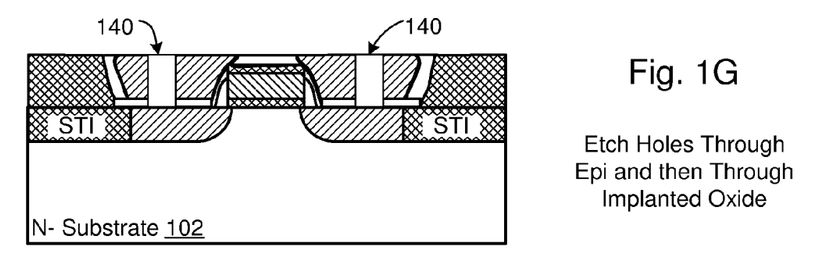
FIG. 1G shows the cross sectional view of FIG. 1F further including holes being etched through epitaxial layer and then through the implanted oxide.
Figure 1H:
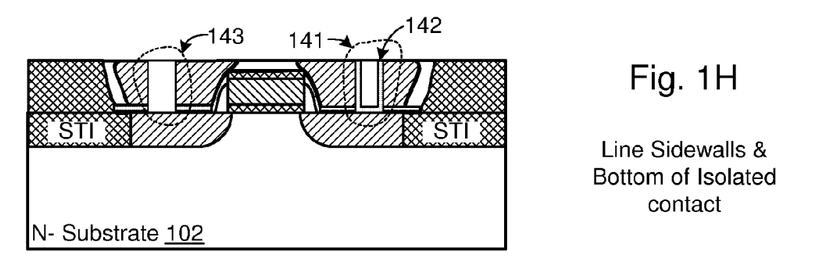
FIG. 1H shows the cross sectional view of FIG. 1G, further including creation of lined sidewalls and bottom of an isolated contact.
Figure 1I:
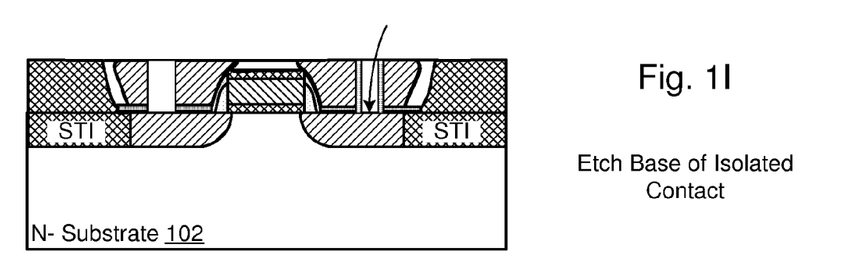
FIG. 1I shows the cross sectional view of FIG. 1H, and further shows etching of a base of the isolated contact.
Figure 1J:
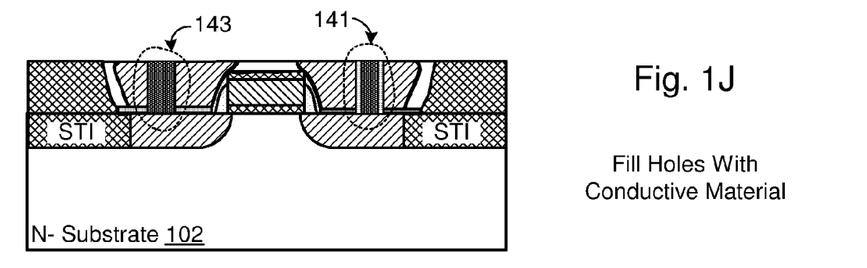
FIG. 1J shows the cross sectional view of FIG. 1I, further including filling the holes with a conductive material.
Figure 1K:
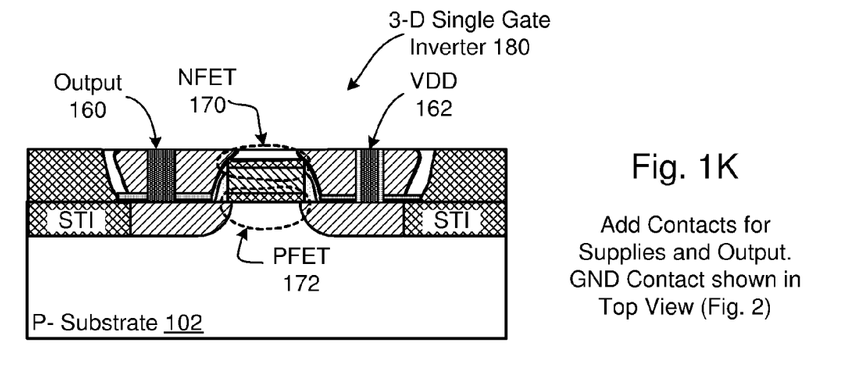
FIG. 1K shows the cross sectional view of FIG. 1J, with further addition of contacts for output, and VDD, with explicit depiction of a single gate controlling a 3-D arrangement of an NFET and a PFET connected as a single gate inverter.
Figure 2:
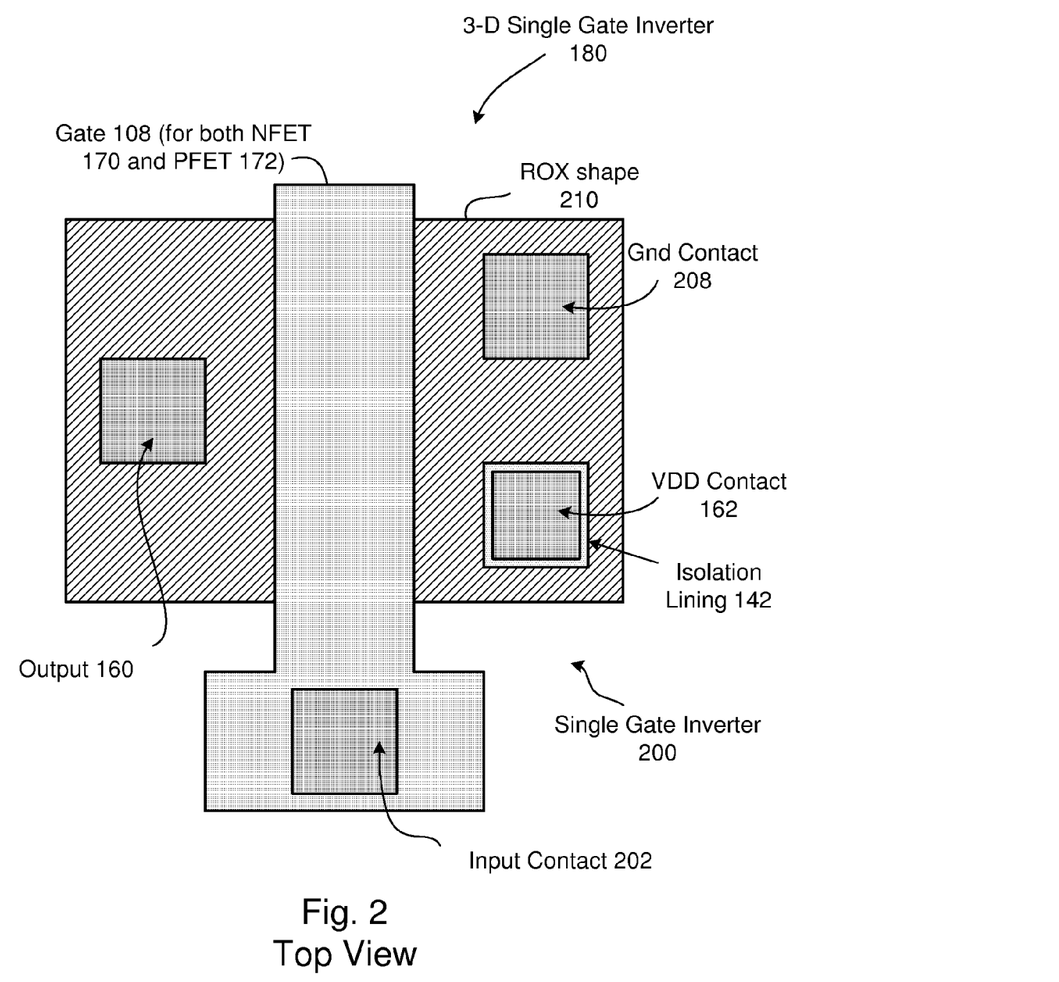
FIG. 2 shows a top view of the 3-D single gate inverter and shows the GND contact for the NFET.

Embodiments of the present invention provide for a 3-D (three dimensional) single gate inverter, shown completed as 3-D single gate inverter 180 in FIG. 1K (cross sectional) and FIG. 2 (top view). The single gate inverter is constructed having a first field effect transistor (FET, PFET used for exemplary purposes herein) at a first (bottom) surface of the gate electrode and a second FET of a type opposite the first FET (NFET used for exemplary purposes herein) at a second (top) surface of the gate electrode.

Source/Drain regions of the first FET are in a semiconductor substrate (or in a suitably doped well in the substrate). Source/Drain regions for the second FET are formed as a first epitaxial growth grown from the source/drain regions of the first FET, but having opposite doping (i.e., if the source/drain regions of the first FET are doped P+, the source/drain regions of the second FET are doped N+. A body of the first FET is in the substrate (or well) and would be doped N– for the first FET. A body of the second FET is formed by a second epitaxial growth opposite to the first epitaxial growth and is of opposite doping to the first epitaxial growth (i.e., if the first epitaxial growth is N+, the second epitaxial growth may be P–, suitable for a body of the second FET.

FIG. 1A shows a cross sectional view of an N– substrate 102 after several processing steps. In particular, shallow trench isolation (STI) regions 116, first source/drain regions 114, a gate electrode 108, a first gate dielectric 104 under gate electrode 108, and a second gate dielectric 106 on top of gate electrode 108 are formed in conventional fashion known to those skilled in the art. For example, the STI regions 116 are formed; then the first gate dielectric material is deposited across the top of the semiconductor substrate; then metal is deposited, the metal, after etching, will become gate electrode 108. Gate electrode 108 thickness, in current technologies, is approximately 400 A (angstroms) thick. Earlier technologies had thicker gates; future technologies are likely to have thinner gates. Then a second gate dielectric material is deposited. A mask protects the "vertical stack" of first gate dielectric 104, gate electrode 108, and second gate dielectric 106 where the FET gates are located from subsequent etching steps. A first etch removes all of the second gate dielectric material except under the mask, i.e., at second gate dielectric 106. A second etch removes all of the metal except under the mask, i.e., gate electrode 108. A third etch removes all of the first dielectric material except under the mask, i.e., first gate dielectric 104.

First source/drain regions 114 are created using convention semiconductor processing, e.g., diffusion or implanting steps.

A plurality of spacers (e.g. a first spacer 110 and a second spacer 112) are formed on both vertical sides of gate electrode 108 through known techniques. For example, an oxide is conformally deposited over a top surface of STI 116, first source/drain regions 114, and second gate oxide 106. The oxide is then isotropically etched, leaving the spacers on the vertical sides of gate electrode 108, first gate dielectric 104, and at least some of a vertical surface of second gate dielectric 106. First spacer 110 and second spacer 112 electrically isolate the vertical sides of gate electrode 108 from future conducting material (a first epitaxial growth) grown above first source/drain regions 114. Although first spacer 110 and second spacer 112 are shown, additional spacers may be required in a given technology to ensure complete electrical insulation of the vertical sides of gate electrode 108.

FIG. 1B illustrates an early stage in growing a first epitaxial layer, N+ Epi 120, which is an N+ epitaxial area grown over P+ first source/drain regions 114 (for simplicity, reference numerals are in general not repeated during the process flow shown in FIGS. 1A-1K). A first FET depicted is a P-channel FET (PFET 172 shown circled in FIG. 1K), known as an PFET, having P+ source and drain regions (first source/drain regions 114) in N– substrate 102.

FIG. 1C illustrates completion of growth of the first epitaxial layer N+ Epi 120 over first source/drain regions 114. First spacer 110 and second spacer 112 prevent N+ Epi 120 from short circuiting to gate electrode 108. Using the exemplary 400 A gate electrode thickness above, a thickness of 1000 A for first epitaxial layer Epi 120 would be a workable thickness, although variations in thickness are contemplated. N+ epi 120 does have to be thick enough to extend above second gate dielectric 106 enough to serve as source/drain regions for NFET 170 (shown in FIG. 1K).

FIG. 1D illustrates a second epitaxial layer P– Epi 122 which is grown over first N+ Epi 120. P– Epi 122 has a P– doping. P– Epi 122 is grown thick enough to spread out from N+ Epi 120 to completely cover second gate dielectric 106 deep enough to provide for an FET body above the second gate dielectric 106 for NFET 170 (shown in FIG. 1K).

FIG. 1E shows the structure of FIG. 1D after growing an oxide 130 over STI 116 areas, and over the second epitaxial layer. Planarization has been performed, using chemical/mechanical polishing or other planarization technique. Planarization has removed most of the second epitaxial layer. Remnants of the second epitaxial layer include P– Epi 122A, 122B, and 122C. P– Epi 122B forms an FET body over second gate dielectric 106, so that gate electrode 108 can control current flow in P– Epi 122B. For example, when gate electrode 108 has a "high" voltage applied, current flows through P– Epi 122B between the N+ Epis 120 grown over source/drain areas 114. At the same time, the applied high voltage on gate electrode 108 causes current to stop flowing in a "bottom channel" between first source/drain areas 114 in PFET 172 (FIG. 1K).

P– Epi 122B is not connected to a bias voltage and "floats" based on leakage and junction voltages of the source/drain epitaxial growths 120. Voltage of P– Epi 122B behaves as a floating body of a silicon on insulator (SOI) FET.

At the end of processing shown in FIG. 1E junctions exist between the P+ first source/drains 114 of the PFET and the N+ source/drains 120 of the NFET. Whereas, for the 3-D single gate inverter depicted, drains of the PFET and the NFET must be connected together (without a junction), the source of the NFET must be connected to a first supply (Gnd), and the source of the PFET must be connected to a second supply (Vdd). Although if a voltage difference between Vdd and Gnd is very small, the P-N junction would not be significantly forward biased, undesirable leakage may still occur. Therefore, electrical insulator, shown in FIG. 1F, is created. An oxygen implant, similar to oxygen implants used in creation of silicon on insulator (SOI) chips creates implanted oxide 136 as shown in FIG. 1F. Implanted oxide 136 is created in first epi 120 and second epi 122 at the junction of first source/drain 114 and first epi 120. Implanted oxide 136 will also be formed in second epi 122 as shown in the same plane implanted oxide 136 is formed in first epi 120.

If implanted oxide 130 is implanted less deeply in first epi 120 than described above, implanted oxide 136 will not be exactly at the junction of first epi 120 and first source/drain areas 114, but slightly above the junction of first epi 120 and first source/drain areas 114. That is, a bottom portion of first epi 120 will exist below implanted oxide 136. First source/drain areas 114 will have some junction capacitance to any portion of first epi 120 that remains above first source/drain areas 114. The bottom portion of first epi 120 will be electrically isolated (except as connected with conducting material to be described later) and no forward biased junction occurs.

If implanted oxide 136 is implanted deeply enough to reach into source/drain areas 114, a top portion of first source/drain areas 114 may exist above implanted oxide 136. Similar to the above discussion, the top portion of first source/drain areas 114 is not connected to a bottom portion (under implanted oxide 136) of first source/drain areas 114 (except as described later). Implanted oxide must not be deep enough in first source/drain areas 114 to destroy their characteristics of source/drains for the PFET (first source/drain areas 114, first gate dielectric 104).

For Vdd-Gnd voltages of approximately one volt or less, implanted oxide 136 must be approximately 100 A (angstroms) thick, at a minimum. A technology supporting 3V Vdd-Gnd would require approximately 200 A thickness of implanted oxide 136.

Connections to power supplies (Vdd, Gnd) and an output must be created. The following several processing descriptions describe how these connections are done.

In FIG. 1G, holes 140 are formed. A first etching is performed using conventional silicon etching techniques to etch through first epi 120, using implanted oxide 136 as an etch stop. A second etching is performed using conventional oxide etching techniques to etch through implanted oxide 136, using first source/drain areas 114 as an etch stop.

In FIG. 1H, using suitable masking and photoresist processing, an oxide liner 142 is formed on sidewalls and bottom of an uncompleted isolated contact 141. An uncompleted non isolated contact 143 is also shown in FIG. 1H.

In FIG. 1I, using an anisotropic etch, a bottom portion of oxide liner 142 is removed as shown by the arrow. Currently, approximately a 50:1 ration of horizontal: vertical etching is possible with currently available reactive ion etching at high voltage and low gas pressure. Other oxide areas on the semiconductor chip are suitably masked to prevent etching of those other oxide areas (e.g., oxide 130). Oxide liner 142 remains on vertical walls of isolated contact 141. Non isolated contact 143, having been suitably masked in the etching steps used to create isolated contact 141, remains unchanged from when non isolated contact 143 was created as a hole 140. Isolated contact 141 and non isolated contact 143 are completed in subsequent process steps described below.

In FIG. 1J, non isolated contact 143 and isolated contact 141 are filled with a conductive material, such as tungsten. Note that, in non isolated contact 143, when filled with conductive material, the contacted first source/drain area 114 is electrically connected to an associated first epi 120 as shown, thereby connecting a drain of PFET 172 and a drain of NFET 170 (explicitly shown in FIG. 1K). Isolated contact 141, when filled with conductive material, makes a contact to a source/drain area 114 that will serve as a source of PFET 172 (see FIG. 1K).

In FIG. 1K, output 160 is connected to non isolated contact 143 for connecting to drains of NFET 170 and PFET 172. Vdd 162 is connected to the isolated contact 141 as shown, providing Vdd to the source/drain area 114 that serves as the source of PFET 172. PFET 172 and NFET 170 share a single gate electrode 108; drains of PFET 172 and NFET 170 are connected at output 160. Vdd 162 is meant as a node or connection, that, when powered up will have a voltage of Vdd supplied. A source of PFET 172 is configured (Vdd 162) for connecting to a Vdd supply. A source of NFET 170 is provided a connection (see FIG. 2, Gnd contact 208) configured for connecting to a Gnd supply. 3-D single gate inverter 180 is thereby formed, and may be further connected to other circuitry on the semiconductor chip for use as a logical inverter, an inverting buffer, a portion of a latch, or other circuitry in which an inverter is needed.

It is understood that, in another embodiment, using similar techniques but with different dopings (semiconductor substrate, first source/drain regions, first epitaxial layer, second epitaxial layer), that the first FET may be an NFET and the second FET may be a PFET.

FIG. 2 shows a top view of 3-D single gate inverter 180 to better show portions of 3-D single gate inverter 180 not easily depicted in a cross sectional view. Output 160 is as shown in FIG. 1K and is a top of non isolated contact 143; Vdd contact 162 is as shown in FIG. 1K and is a top of isolated contact 141. Remaining portion (vertical wall lining) of liner 142 is as shown in FIG. 1H. Ground contact 208 provides for connection to a portion of first epi 120 used as the source of NFET 170. Input contact 202 is an electrical contact to gate electrode 108. ROX 210 (Recessed Oxide area) defines boundaries of STI 116.

Figure 3A:
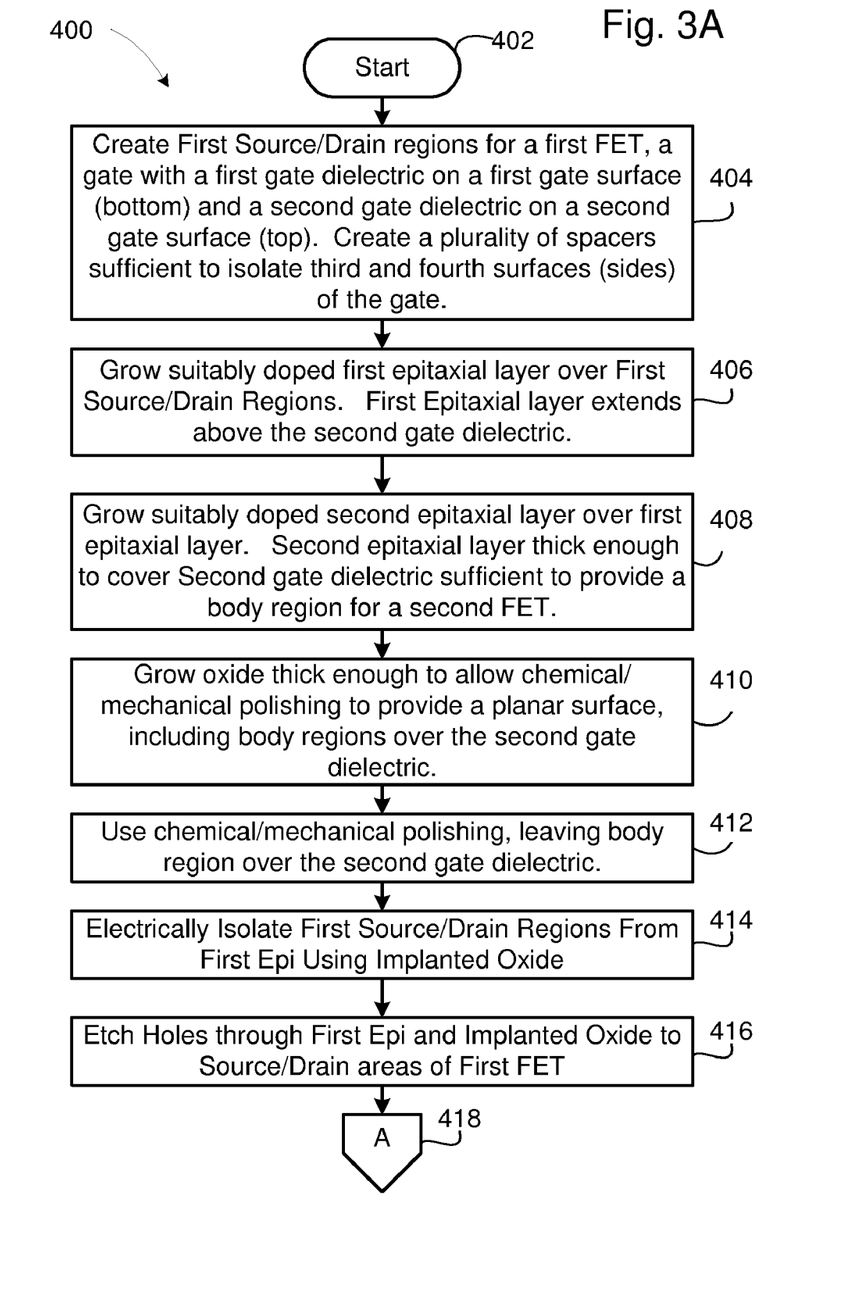
FIGS. 3A and 3B collectively show a method for creating the single gate inverter.
Figure 3B:
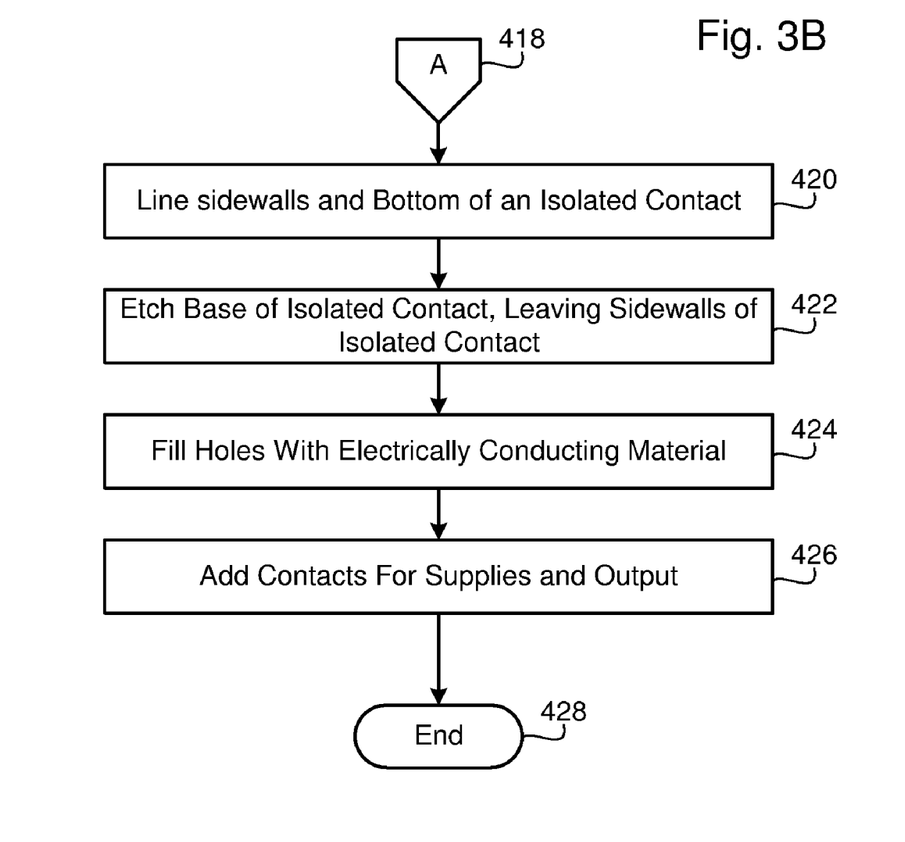

FIG. 3A and FIG. 3B together show a method 400 for making the 3-D single gate inverter (3-D single gate inverter 180 as described above). Method 400 begins at block 402.

In block 404, Shallow Trench Isolation (STI) areas are formed in an N− doped semiconductor substrate. A first thin oxide is deposited on a top surface of a semiconductor substrate, i.e., the thin oxide used for first gate dielectric 104 in FIG. 1A. A metal layer is deposited over the first thin oxide layer, suitable for a gate (e.g., gate electrode 108 of FIG. 1A). A second thin oxide is deposited over the top of the metal layer. A mask defines where the FET gate is to be. A first etch removes all of the second thin oxide except under the mask, leaving second gate dielectric 106 (FIG. 1A). A second etch removes the entire metal layer except gate electrode 108. A third etch removes the entire first thin oxide layer except first gate dielectric 104.

P+ first Source/Drain regions for a first FET (PFET) are formed by implant or diffusion processes (see First source/drain regions 114 in FIG. 1A).

A plurality of spacers are formed on vertical sides of the gate electrode to electrically isolate vertical (that is, perpendicular to the plane of the semiconductor substrate) sides of the gate electrode from subsequent epitaxial growths. A spacer may be formed by depositing a conformal oxide layer and isotropically etching the conformal layer. Typically, two or more spacers are required to ensure electrical insulation of the vertical sides of the gate electrode.

In block 406, an N+ first epitaxial (epi) layer is grown over the first drain/source regions. Epitaxial growth is performed until the first epitaxial layer extends above the gate electrode and the second gate dielectric enough to be suitable for functioning as second source/drain regions associated with the second gate dielectric for a second FET.

In block 408, a second epitaxial layer, doped P−, is grown over the first epitaxial layer. The second epitaxial layer must be thick enough such that the second epitaxial layer fills the void above the second gate dielectric and is thick enough over the second gate dielectric to be suitable as an FET body for the second FET.

In block 410, an oxide layer is grown that is thick enough to allow subsequent planarization by a process such as chemical/mechanical polishing. For example, the oxide layer has to be at least as thick as depicted in FIG. 1E as oxide 130. The oxide would also grow over the second epitaxial layer, forming a nonplanar structure.

In block 412, planarization, using chemical/mechanical polishing or other process is performed. Substantially. all of the second epitaxial layer is removed except (as shown in FIG. 1E) above the second gate dielectric (122B, FIG. 1E) and between remaining portions (122A, 122C, FIG. 1E) of the second epitaxial layer and the oxide layer. As depicted in FIG. 1E, the portions of the second epitaxial layer between the oxide grown in block 410 and the remaining portions of the first epitaxial layer are substantially vertical to the plane of N− substrate 102 and these substantially vertical portions of the second epitaxial layer are at distal sides of the first epitaxial layer relative to the portion of the second epitaxial layer (122B, FIG. 1E) over the second gate dielectric. "Substantially vertical" is not perfectly vertical, as the first epitaxial layer (N+ Epi 120 will grow outward over STI 116 slightly, as shown in FIG. 1O). As shown in FIG. 1D, the second epitaxial layer P− Epi 122 grows from N+ Epi 120 and therefore the "substantially vertical" portion of P− Epi 122 is also not completely vertical. "Substantially vertical" is merely a convenient term to distinguish remaining portions of the second epitaxial layer on distal sides of the remaining first epitaxial layer from the remaining portion of the second epitaxial layer over the second gate dielectric.

In block 414, the first source/drain regions are electrically isolated by an electrical insulator from the first epitaxial growth. An oxygen implant, as shown in FIG. 1F, can create an implanted oxide (implanted oxide 136, FIG. 1F). The electrical insulator is needed to prevent forward biasing of the junctions formed between first source/drain regions and first epitaxial layer. In the example inverter shown in FIG. 1K, isolated contact Vdd 162 connects a source of PFET 172 to Vdd. The portion of first epitaxial layer above the source PFET 172 serves as a source of NFET 170. For Vdd-Gnd voltage differences of more than about a half a volt the P+/N+ junction that would exist but for the electrical insulator formed in block 414 would become forward biased. Even if Vdd-Gnd is less than a half a volt, significant leakage currents would flow. Elimination of electrical insulator is contemplated for very low values of Vdd-Gnd where leakage currents may be tolerable for particular applications.

In block 416, holes are etched through the first epitaxial layer and the electrical insulator (implanted oxide). See holes 140 in FIG. 1G. In a first etch, the first epitaxial layer (epi 120) is etched through, with the electrical insulator (implanted oxide 136) used as an etch stop. In a second etch, the holes are extended through the electrical insulator with the source/drains (P+ 114) for the PFET used as an etch stop.

Block 418 (A) is a process continuation block from FIG. 3A to FIG. 3B.

An isolated contact must be formed such that Vdd can be connected to a source of PFET 172 (FIG. 1K) without being connected to a source of NFET 170 (FIG. 1K). In block 420, sidewalls and bottom of the isolated contact are lined with an insulator, such as an oxide growth, shown as oxide growth 142 in FIG. 1H. In block 422, an anisotropic etch is used to remove the bottom portion of the oxide growth of block 420, as shown in FIG. 1I. Holes (holes 140 of FIG. 1G) that are not intended to become isolated contacts (i.e., are non isolated contacts, such as non isolated contact 143, FIG. 1H, 1J) are suitably masked during processing of blocks 420 and 422.

In block 424, non-isolated and isolated contacts are filled with suitable conductive material, such as tungsten.

In block 426, contacts are made (or completed) for supplies, input, and output. Vdd 162 and output 160 are shown in FIG. 1K and FIG. 2. Input contact 202 and Gnd contact 208 are shown in FIG. 2.

Block 428 ends method 400.

Figure 4:
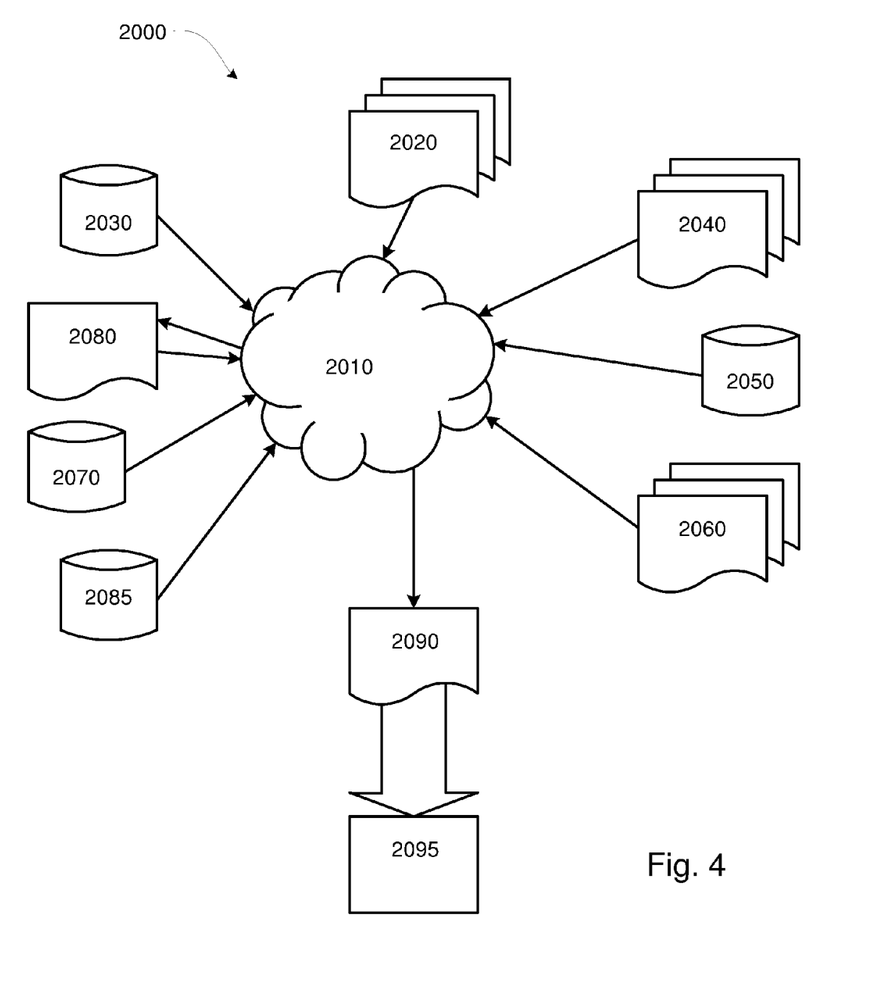
FIG. 4 shows a process and design structure for making a semiconductor chip comprising the 3-D single gate inverter.

FIG. 4 shows a block diagram of an example design flow 2000 that may be used for the 3-D single gate inverter described herein. Design flow 2000 may vary depending on the type of integrated circuit being designed. For example, a design flow 2000 for a static random access memory may differ from a design flow 2000 for a dynamic random access memory. In addition, design flow 2000 may differ for different semiconductor processes. Design structure 2020 is preferably an input to a design process 2010 and may come from an IP provider, a core developer, or other design company or may be generated by the operator of the design flow, or from other sources. Design structure 2020 comprises circuits and semiconductor constructions making up the circuits described above, for examples in FIGS. 1A-1K, and FIG. 2 in the form of schematics or HDL, a hardware-description language (e.g., Verilog, VHDL, C, etc.). Design structure 2020 may be contained on one or more tangible computer readable medium. For example, design structure 2020 may be a text file or a graphical representation of circuits described above. Examples of tangible computer readable medium include hard disks, floppy disks, magnetic tapes, CD ROMs, DVD, flash memory devices, and the like. Design process 2010 preferably synthesizes (or translates) the circuits described above into a netlist 2080, where netlist 2080 is, for example, a list of wires, transistors, logic gates, control circuits, I/O, models, etc. that describes the connections to other elements and circuits in an integrated circuit design and recorded on the at least one computer readable medium. This may be an iterative process in which netlist 2080 is resynthesized one or more times depending on design specifications and parameters for the circuit.

Design process 2010 may include using a variety of inputs; for example, inputs from library elements 2030 which may house a set of commonly used elements, circuits, and devices, including models, layouts, and symbolic representations, for a given manufacturing technology (e.g., different technology nodes, 32 nm, 45 nm, 90 nm, etc.), design specifications 2040, characterization data 2050, verification data 2060, design rules 2070, and test data files 2085 (which may include test patterns and other testing information). Design process 2010 may further include, for example, standard circuit design processes such as timing analysis, verification, design rule checking, place and route operations, etc. One of ordinary skill in the art of integrated circuit design can appreciate the extent of possible electronic design automation tools and applications used in design process 2010 without deviating from the scope and spirit of the invention. The design structure of the invention is not limited to any specific design flow.

Design process 2010 preferably translates an embodiment of the invention as shown in the various logic diagrams and the underlying circuitry along with any additional integrated circuit design or data (if applicable), into a second design structure 2090. Design structure 2090 resides on a tangible computer readable storage medium in a data format used for the exchange of layout data of integrated circuits (e.g. information stored in a GDSII (GDS2), GL1, OASIS, or any other suitable format for storing such design structures). Design structure 2090 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in the logic diagrams in the figures. Design structure 2090 may then proceed to a stage 2095 where, for example, design structure 2090 proceeds to tape-out, is released to manufacturing, is released to a mask house, is sent to another design house, is sent back to the customer, etc.

What is claimed is:

1. A 3-D (Three dimensional) single gate inverter comprising:
   a semiconductor substrate;
   a first FET (Field Effect Transistor) of a first type and a second FET of a second type, the second type opposite of the first type;
   a gate electrode having a first gate dielectric for the first FET on a first surface and a second gate dielectric for the second FET on a second surface, the second surface on an opposite side of the gate electrode from the first surface, the first and second surfaces being parallel with a top surface of the semiconductor substrate, a third surface and a fourth surface of the gate electrode being electrically isolated, the third and fourth surfaces being perpendicular to the top surface of the semiconductor substrate;

first source/drain regions for the first FET in the semiconductor substrate;

a first epitaxial layer grown from the first source/drain regions extending above the second gate dielectric, the first epitaxial layer having an opposite doping as the first source/drain regions, the first epitaxial layer forming second source/drain regions for the second FET;

and a second epitaxial layer grown from the first epitaxial layer having a doping opposite the doping of the first epitaxial layer, the second epitaxial layer covering the second gate dielectric.

2. The 3-D single gate inverter of claim 1, further comprising one or more spacers for causing the third and the fourth surface of the gate electrode to be electrically isolated from the first epitaxial layer.

3. The 3-D single gate inverter of claim 1, further comprising an electrical insulator between the first source/drain areas and the first epitaxial layer.

4. The 3-D single gate inverter of claim 3, wherein the electrical insulator comprises an implanted oxide.

5. The 3-D single gate inverter of claim 1, wherein the first FET is a PFET and the second FET is an NFET.

6. The 3-D single gate inverter of claim 1, wherein the first FET is an NFET and the second FET is a PFET.

7. The 3-D single gate inverter of claim 1, further comprising an isolated contact for making electrical connection to a source of the first FET.

8. The 3-D single gate inverter of claim 1, further comprising an electrical connection of a drain of the first FET and a drain of the second FET.

* * * * *